(12) United States Patent
Nancekievill

(10) Patent No.: US 7,336,099 B1
(45) Date of Patent: Feb. 26, 2008

(54) MULTIPLEXER INCLUDING ADDITION ELEMENT

(75) Inventor: Donimic Nancekievill, High Wycombe (GB)

(73) Assignee: Altera Corporation, San Jose, CA (US)

( * ) Notice: Subject to any disclaimer, the term of this patent is extended or adjusted under 35 U.S.C. 154(b) by 292 days.

(21) Appl. No.: 11/021,685

(22) Filed: Dec. 23, 2004

(51) Int. Cl.
*G06F 7/38* (2006.01)
*H03K 19/177* (2006.01)
(52) U.S. Cl. .......................... 326/40; 326/38; 708/235
(58) Field of Classification Search ............ 326/38–41; 708/230–236
See application file for complete search history.

(56) References Cited

U.S. PATENT DOCUMENTS 6,476,634 B1 * 11/2002 Bilski .......................... 326/40
7,167,022 B1 * 1/2007 Schleicher et al. ........... 326/41

* cited by examiner

*Primary Examiner*—Daniel Chang
(74) *Attorney, Agent, or Firm*—Townsend and Townsend and Crew LLP

(57) ABSTRACT

A multiplexer can be implemented in a programmable logic device, using addition elements which are optimised for performing a one-bit addition function. A logic device receives a first data input value and a first select input. The logic device then routes the first data input to the addition element as a first input one-bit value, and routes either the first data input or its inverse to the addition element as a second input one-bit value, depending on the value of the first select input.

20 Claims, 4 Drawing Sheets

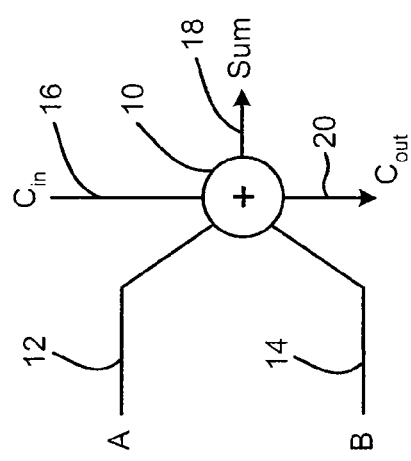
FIG. 1
(Prior Art)
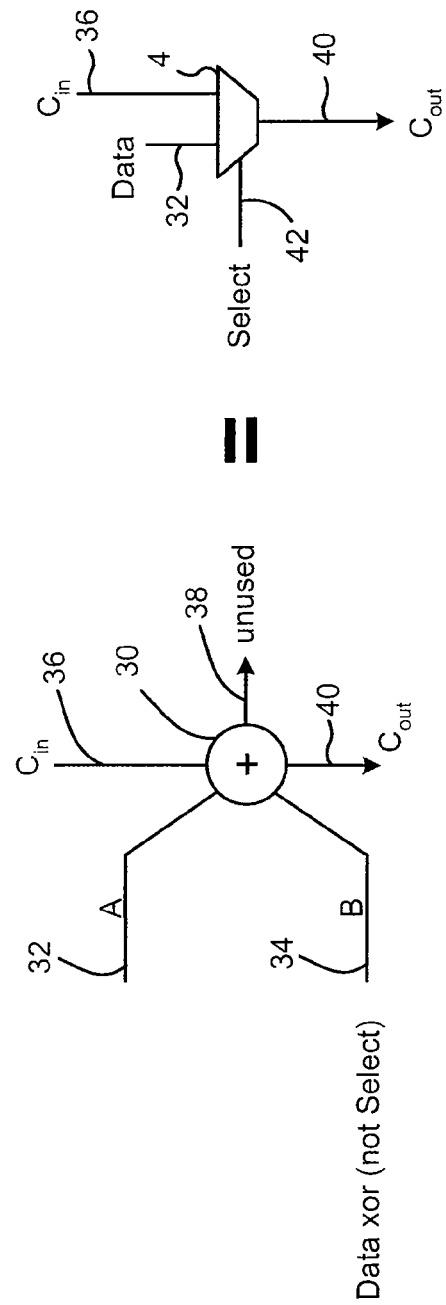
FIG. 2(a)
FIG. 2(b)

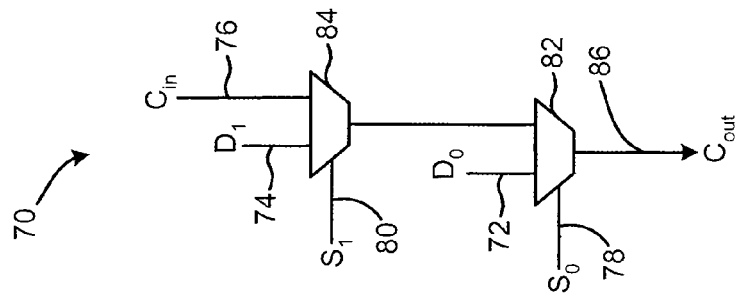
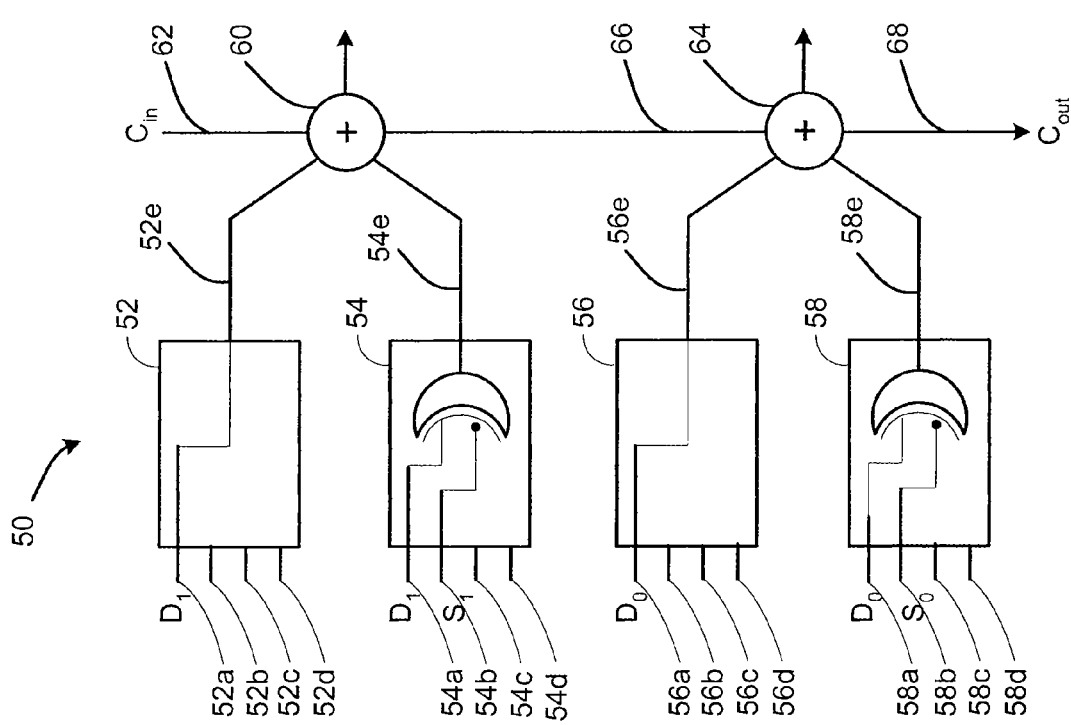
FIG. 3(b)
FIG. 3(a)

MULTIPLEXER INCLUDING ADDITION ELEMENT

TECHNICAL FIELD OF THE INVENTION

This invention relates to a multiplexer, and in particular to a multiplexer which can be implemented in a programmable logic device. More particularly, the invention relates to a multiplexer, which can be implemented in a programmable logic device, using logic resources which are provided for performing an arithmetic function.

BACKGROUND OF THE INVENTION

A programmable logic device, such as a field programmable gate array (FPGA), contains logic resources, which can be programmed to perform particular functions, so that the device has an intended functionality. In a purely programmable device, there may be no differentiation between the logic resources, and then every desired function must be implemented using these generic resources.

However, the operation of the programmed device may be more efficient if the device is able to use resources which have a particular dedicated function. That is, if some of the logic resources of the device have a dedicated function, then that function can probably be carried out more efficiently using those resources. As a result, programmable logic devices commonly contain some logic resources which can be programmed to perform a wide range of functions, plus some resources which are optimised for performing specific functions.

For example, the Stratix® II FPGA, available from Altera Corporation, contains some logic resources, which are optimised for particular functions. Since programmable logic devices commonly have to perform arithmetic functions on input data, particularly if they are used in signal processing applications, for example, the Stratix® II FPGA contains logic resources, which are optimised for performing addition.

Programmable logic devices are also commonly used to implement multiplexers, since multiplexers are often used in a wide range of functions.

In particular, there are two types of multiplexer, which are commonly implemented. Firstly, there is a priority multiplexer, in which there are multiple select input signals, and multiple data signals. The select input signals have a priority ordering. For example, in the case of a priority multiplexer having two select input signals and three data signals, if the higher priority select input signal has a first binary value (for purposes of illustration, this can be taken to be the value "1", but this is not necessarily the case), then a first data signal is supplied to the output, irrespective of the value of the lower priority select input signal. However, if the higher priority select input signal has a second binary value (that is, the value "0" if the first binary value is taken to be the value "1"), then either the second or third data signal is supplied to the output, depending on the value of the lower priority select input signal.

Secondly, there is a "one hot" multiplexer, in which there are the same numbers of select input signals and data signals. At any time, only one of the select input signals has a first binary value (for purposes of illustration, this can again be taken to be the value "1", but this is not necessarily the case), which causes the corresponding data signal to be supplied to the output.

In practice, if a "one hot" multiplexer function is required, then this can be implemented using a priority multiplexer, provided that it is ensured that only one of the select input signals of the priority multiplexer has the first binary value at any time.

However, conventional "one hot" multiplexers are faster than priority multiplexers, and so "one hot" multiplexers are implemented where possible, when the functionality of a "one hot" multiplexer is required. Nevertheless, all multiplexers introduce significant delays in the operation of designs implemented in an FPGA, thereby limiting the speed at which the design can operate.

SUMMARY OF THE INVENTION

The present invention relates to a multiplexer, which can be implemented in a programmable logic device, using resources which are optimised for performing an addition function.

According to an aspect of the invention, there is provided a multiplexer, which includes an addition element, adapted to receive first and second one-bit values and a carry input value, and to supply a carry output value, the carry output value being high when two or more of the first and second one-bit values and the carry input value are high. The multiplexer also includes a logic device, for receiving a first data input value and a first select input, and the logic device is adapted to route the first data input to the addition element as the first one-bit value. The logic device is also adapted to route the first data input to the addition element as the second one-bit value when the first select input takes a first value, and is adapted to route an inverse of the first data input to the addition element as the second one-bit value when the first select input takes a second value.

According to another aspect of the invention, there is provided a multi-input multiplexer, which includes a first addition element, adapted to receive first and second one-bit values and a first carry input value, and to supply a first carry output value, the first carry output value being high when two or more of the first and second one-bit values and the first carry input value are high. The multiplexer also includes a first logic device, for receiving a first data input value and a first select input.

The multiplexer also includes a second addition element, adapted to receive third and fourth one-bit values and a second carry input value, and to supply a second carry output value, the second carry output value being high when two or more of the third and fourth one-bit values and the second carry input value are high. The multiplexer also includes a second logic device, for receiving a second data input value and a second select input.

The first logic device is adapted to route the first data input to the first addition element as the first one-bit value. The first logic device is also adapted to route the first data input to the first addition element as the second one-bit value when the first select input takes a first value, and is adapted to route an inverse of the first data input to the first addition element as the second one-bit value when the first select input takes a second value.

The second logic device is adapted to route the second data input to the second addition element as the third one-bit value. The second logic device is also adapted to route the second data input to the second addition element as the fourth one-bit value when the second select input takes a first value, and is adapted to route an inverse of the second data input to the second addition element as the fourth one-bit value when the second select input takes a second value.

The second carry output value of the second addition element is supplied to the first addition element as the first carry input value.

According to a further aspect of the invention, there is provided a multi-input multiplexer, which includes a first addition element, adapted to receive first and second one-bit values and a first carry input value, and to supply a first carry output value, the first carry output value being high when two or more of the first and second one-bit values and the first carry input value are high. The multiplexer also includes a first logic device, for receiving a first data input value and a first select input.

Further, the multiplexer includes a second addition element, adapted to receive third and fourth one-bit values and a second carry input value, and to supply a second carry output value, the second carry output value being high when two or more of the third and fourth one-bit values and the second carry input value are high. The multiplexer also includes a second logic device, for receiving second and third data input values and second and third select inputs.

The first logic device is adapted to route the first data input to the first addition element as the first one-bit value. The first logic device is also adapted to route the first data input to the first addition element as the second one-bit value when the first select input takes a first value, and is adapted to route an inverse of the first data input to the first addition element as the second one-bit value when the first select input takes a second value.

The second logic device is adapted to select between the second and third data input values based on the third select input, and to form an intermediate value as the result of the selection. The second logic device is also adapted to route the intermediate value to the second addition element as the third one-bit value. Further, the second logic device is adapted to route the intermediate value to the second addition element as the fourth one-bit value when the second select input takes a first value, and is adapted to route an inverse of the intermediate value to the second addition element as the fourth one-bit value when the second select input takes a second value. The second carry output value of the second addition element is supplied to the first addition element as the first carry input value.

Multiplexers of the present invention have the advantage that they can be implemented in programmable logic devices, using addition elements that are already provided in the device.

According to a still further aspect of the invention, there is provided a field programmable gate array, which includes multiple one-bit addition elements, each having carry inputs and carry outputs, with the carry outputs of the one-bit addition elements being connected to the carry inputs of respective succeeding one-bit addition elements in a chain. The device includes logic resources, which are connected to receive input signals and to supply output signals to one-bit addition elements of said chain. Each of the logic resources is adapted to receive a respective data input and select input, supply the respective data input as a first input to the respective one-bit addition element, and supply a logical XOR of the respective data input and the inverse of the select input as a second input to the respective one-bit addition element.

The field programmable gate array according to the present invention is able to use its existing logic resources to implement a multiplexer, which can operate at high speed.

BRIEF DESCRIPTION OF DRAWINGS

FIG. 1 is a block schematic diagram, showing the operation of a logic function element, which is optimised to perform an arithmetic function.

FIG. 2 is a block schematic diagram, showing the logic function element of FIG. 1, with inputs causing it to act as a multiplexer in accordance with the present invention.

FIG. 3 is a block schematic diagram of an arithmetic logic module, with inputs causing it to act as a multiplexer in accordance with a further embodiment of the present invention.

DETAILED DESCRIPTION OF PREFERRED EMBODIMENTS

Figure 4A:
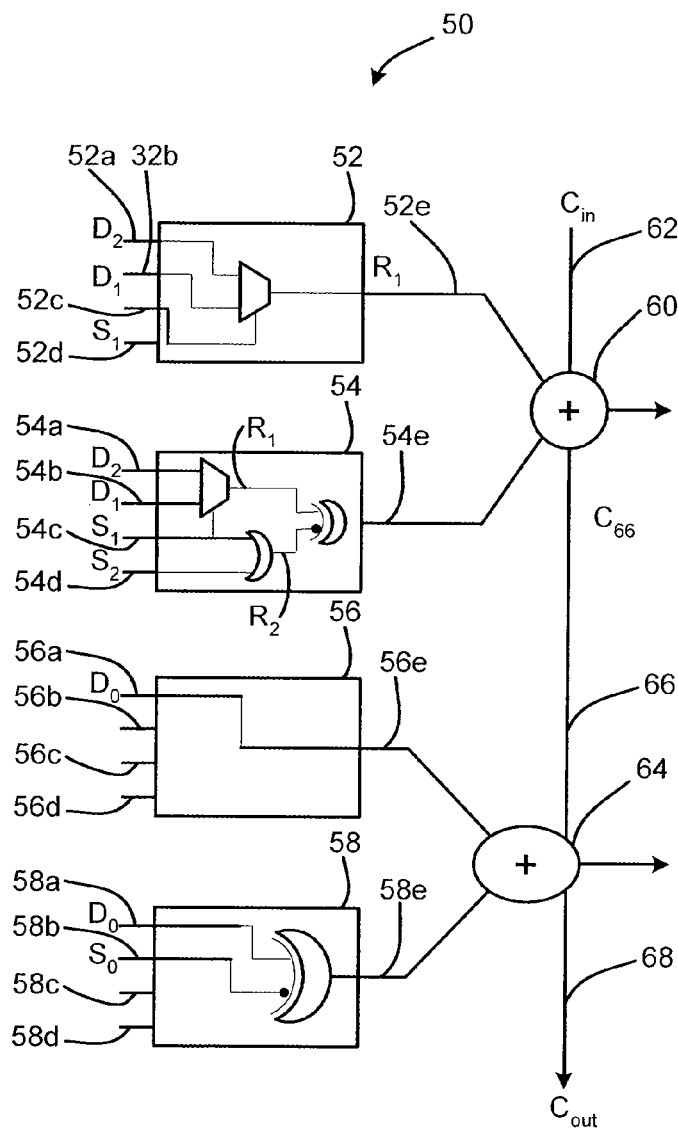
FIG. 4 is a block schematic diagram of an arithmetic logic module, with inputs causing it to act as a multiplexer in accordance with a further embodiment of the present invention.

FIG. 1 shows a logic function element, which is optimised for performing an addition function. Specifically, the logic function element 10 is adapted to perform a one-bit addition. Thus, a first data bit A is received on a first data line 12, and a second data bit B is received on a second data line 14. In addition, the logic function element 10 is adapted to form part of a chain of such logic function elements, allowing multi-bit addition to be performed. Thus, the logic function element 10 also receives a carry input $C_{in}$ on a carry input line 16.

The sum of the inputs is provided on an output line 18, while a carry output $C_{out}$ is provided on a carry output line 20.

When multiple one-bit addition logic function elements are connected in a chain, to allow multi-bit addition to be performed, the carry output line 20 of one logic function element is connected to the carry input line 16 of the next logic function element in the chain.

As will be appreciated by the person skilled in the art, the Sum value on the output line 18 is high when one of the inputs A, B and $C_{in}$ is high, or when all three of the inputs A, B and $C_{in}$ are high. By contrast, the Sum value on the output line 18 is low when none of the inputs A, B and $C_{in}$ is high, or when two of the inputs A, B and $C_{in}$ are high.

In terms of Boolean logic, this can be expressed as:

Sum=A xor B xor $C_{in}$.

Further, the value on the carry output line 20 is high when two or three of the inputs A, B and $C_{in}$ are high, but is low when none or one of the inputs A, B and $C_{in}$ is high.

Since it is a common requirement that a programmable logic device should be able to perform large numbers of arithmetic functions, programmable logic devices commonly contain logic function elements such as the logic function element 10, which are designed to perform one-bit additions highly efficiently.

As will be shown below, with reference to FIG. 2, these logic function elements can be made to operate as multiplexers, by suitable manipulation of their inputs.

FIG. 2(*a*) is a block schematic diagram corresponding to FIG. 1. Specifically, a logic function element 30 receives a first data bit A on a first data line 32, and a second data bit B on a second data line 34. The logic function element 30 also receives a carry input $C_{in}$ on a carry input line 36. The sum of the inputs is provided on an output line 38, while a carry output $C_{out}$ is provided on a carry output line 40.

In order to allow the logic function element 30 to operate as a multiplexer, a Data signal is provided as the input A on the first data line 32. Further, the second data line 34 receives an input B, which is formed as the exclusive OR of the Data signal and the inverse of a Select signal.

As discussed above, with reference to FIG. 1, when A=B, it follows that $C_{out}$=A=B. If A and B are both high, the value on the carry output line 20 will be high, because at least two of the inputs A, B and $C_{in}$ are high, irrespective of the value of $C_{in}$. By contrast, if A and B are both low, then the value on the carry output line 20 will be low, because no more than one of the inputs A, B and $C_{in}$ can be high.

On the other hand, when A≠B, it follows that $C_{out}$=$C_{in}$. Exactly one of A and B will be high, so the value of $C_{in}$ will determine whether or not two of the inputs A, B and $C_{in}$ are high.

In this case, as shown in FIG. 2(a), it is the value of the Select signal which determines whether A=B or A≠B.

More specifically, input B is formed as the exclusive OR of input A and the inverse of a Select signal. The following table, Table 1, shows the result of this logic:

TABLE 1

| Data (A) | Select | not Select | Data xor (not Select) (B) | Result |
|---|---|---|---|---|
| 1 | 1 | 0 | 1 | A = B |
| 1 | 0 | 1 | 0 | A ≠ B |
| 0 | 1 | 0 | 0 | A = B |
| 0 | 0 | 1 | 0 | A ≠ B |

Thus, as shown in Table 1, if the Select signal is high, the logic operates such that A=B, and, as discussed above, $C_{out}$=A. By contrast, if the Select signal is low, the logic operates such that A≠B, and, as discussed above, $C_{out}$=$C_{in}$. The value of the Select signal therefore determines whether the carry output on line 40 is taken from the first input A, or the carry input $C_{in}$, showing that the element 30 is acting as a two-input multiplexer.

This is illustrated in FIG. 2(b), which shows a multiplexer, which is the logical equivalent of the multiplexer described above, implemented using the one-bit addition element 30. Thus, two input signals, Data and $C_{in}$, are received on input lines 32, 36 respectively, and the output $C_{out}$ is provided on line 40. A Select signal is provided on a line 42, while the multiplexer 44 represents the one-bit addition element 30, plus the logic required to form the exclusive OR of the Data input and the inverse of the Select signal.

In practice, designers of circuits often require to implement multiplexers which have many inputs. In accordance with an embodiment of the present invention, such multiple-input multiplexers can be implemented using chains of two-input multiplexers. This is particularly convenient because, as mentioned above, FPGAs commonly contain chains of one-bit addition elements, in order to allow efficient multi-bit addition.

FIG. 3 is a block schematic diagram, showing the implementation of a three-input multiplexer.

More specifically, FIG. 3 shows the implementation of a three-input multiplexer, using an adaptive logic module of a Stratix® II FPGA, available from Altera Corporation. As shown in FIG. 3(a), the adaptive logic module includes four 4-input look-up tables 52, 54, 56, 58. Thus, the first 4-input look-up table 52 has four inputs 52a, 52b, 52c, 52d, and an output 52e. The second 4-input look-up table 54 has four inputs 54a, 54b, 54c, 54d, and an output 54e. The third 4-input look-up table 56 has four inputs 56a, 56b, 56c, 56d, and an output 56e. The fourth 4-input look-up table 58 has four inputs 58a, 58b, 58c, 58d, and an output 58e.

The operation of a 4-input look-up table, to implement a desired logical function, is well known to the person skilled in the art.

The outputs 52e, 54e of the first and second 4-input look-up tables 52, 54 are connected to a first one-bit addition element 60, which also receives a carry input $C_{in}$ on a carry input line 62. The outputs 56e, 58e of the third and fourth 4-input look-up tables 56, 58 are connected to a second one-bit addition element 64, which also receives the carry output from the first one-bit addition element 60 as its carry input on the line 66. The carry output $C_{out}$ from the second one-bit addition element 64 is supplied on the carry output line 68.

The first look-up table 52 is used to route the value on the first input 52a to the output 52e. The second look-up table 54 is used to form the exclusive OR of the value on the first input 54a and the inverse of the value on the second input 54b, and to route the result to the output 54e.

The third look-up table 56 is used to route the value on its first input 56a to the output 56e. The fourth look-up table 58 is used to form the exclusive OR of the value on its first input 58a and the inverse of the value on its second input 58b, and to route the result to its output 58e.

Further, a first data input $D_0$ is supplied to the first inputs 56a, 58a of both the third and fourth look-up tables 56, 58. A first select signal $S_0$ is supplied to the second input 56b of the fourth look-up table 58. A second data input $D_1$ is supplied to the first inputs 52a, 54a of both the first and second look-up tables 52, 54. A second select signal $S_1$ is supplied to the second input 54b of the second look-up table 54. A carry input $C_{in}$ is supplied on a carry input line 62.

As discussed above, with reference to FIG. 2, the one-bit addition element 64 therefore acts as a multiplexer, with the value of the first select signal $S_0$ determining whether the value on its carry output 68 is the first data input $D_0$ or the value on its carry input line 66. Further, the one-bit addition element 60 also acts as a multiplexer, with the value of the second select signal $S_1$ determining whether the value on its carry output 66 is the second data input $D_1$ or the value on its carry input line 62. The value on the carry output of the one-bit addition element 60 is the value on the carry input line of the one-bit addition element 64.

FIG. 3(b) shows a multiplexer 70, which is the logical equivalent of the multiplexer described above, implemented using the adaptive logic module 50. Thus, three input signals $D_0$, $D_1$ and $C_{in}$, are received on input lines 72, 74, 76 respectively, and first and second Select signals $S_0$, $S_1$ are supplied on lines 78, 80 respectively. The multiplexer 82 represents the one-bit addition element 64, plus the logic required to form the exclusive OR of $D_0$ and the inverse of $S_0$, while the multiplexer 84 represents the one-bit addition element 60, plus the logic required to form the exclusive OR of $D_1$ and the inverse of $S_1$. The output $C_{out}$ is provided on line 86.

It can therefore be seen that the multiplexer 70 acts as a priority multiplexer, since the select input signals have a priority ordering. Specifically, the first Select signal $S_0$ has a higher priority than the second Select signal $S_1$. If the higher priority Select signal $S_0$ has the value "1", then the first data signal $D_0$ is supplied to the output, irrespective of the value of the lower priority select input signal $S_1$. However, if the higher priority Select signal $S_0$ has the value "0", then either the second data signal $D_1$ or the carry input $C_{in}$ is supplied to the output, depending on the value of the lower priority select input signal $S_1$.

It will also be apparent that a larger multiplexer can be formed by connecting more than one adaptive logic module 50 in a chain, with the carry output line 68 of one such module connected to the carry input line 62 of the next module.

This structure makes it possible to implement a multiplexer, which operates at high speed, because, in an FPGA with resources dedicated to addition, the routing between the carry outputs and the carry inputs of the one-bit multipliers is typically very fast. Since it is often the routing between the logic resources which is the factor which limits the maximum speed of an FPGA design, this means that a multiplexer implemented in this way can operate at high speed.

As mentioned above, a multiplexer larger than that shown in FIG. 3(a) can be formed by connecting more than one such multiplexer in a chain. As another possibility, FIG. 4 shows the implementation of a four-input multiplexer, also using an adaptive logic module of a Stratix® II FPGA, available from Altera Corporation. As shown in FIG. 4(a), the adaptive logic module 50 is the same as the adaptive logic module 50 in FIG. 3(a), and includes four 4-input look-up tables 52, 54, 56, 58. Thus, the first 4-input look-up table 52 has four inputs 52a, 52b, 52c, 52d, and an output 52e. The second 4-input look-up table 54 has four inputs 54a, 54b, 54c, 54d, and an output 54e. The third 4-input look-up table 56 has four inputs 56a, 56b, 56c, 56d, and an output 56e. The fourth 4-input look-up table 58 has four inputs 58a, 58b, 58c, 58d, and an output 58e.

The outputs 52e, 54e of the first and second 4-input look-up tables 52, 54 are connected to a first one-bit addition element 60, which also receives a carry input $C_{in}$ on a carry input line 62. The outputs 56e, 58e of the third and fourth 4-input look-up tables 56, 58 are connected to a second one-bit addition element 64, which also receives the carry output from the first one-bit addition element 60 as its carry input on the line 66. The carry output $C_{out}$ from the second one-bit addition element 64 is supplied on the carry output line 68.

The first look-up table 52 is used to produce an output, on its output 52e, which is the same as the result of multiplexing together the values on its first input 52a and its second input 52b, under the control of the value on its third input 52c. FIG. 4(a) provides a schematic representation of this logic.

The second look-up table 54 is used to produce an output, on its output 54e, which is the same as the result of: multiplexing together the values on its first input 54a and its second input 54b, under the control of the value on its third input 54c, to form a first result $R_1$ (when the value on the third input 54c is high, the first result is equal to the value on the second input 54b, otherwise, the first result is equal to the value on the first input 54a); forming the OR of the values on its third input 54c and its fourth input 54d, to form a second result $R_2$; and forming the exclusive OR of the first result $R_1$ and the inverse of the second result (not $R_2$). FIG. 4(a) provides a schematic representation of this logic.

The third look-up table 56 is used to route the value on its first input 56a to the output 56e.

The fourth look-up table 58 is used to produce an output, on its output 58e, which is the same as the result of forming the exclusive OR of the value on its first input 58a and the inverse of the value on its second input 58b.

Further, a first data input $D_0$ is supplied to the first inputs 56a, 58a of both the third and fourth look-up tables 56, 58. A first select signal $S_0$ is supplied to the second input 56b of the fourth look-up table 58. A second data input $D_1$ is supplied to the second inputs 52b, 54b of both the first and second look-up tables 52, 54. A third data input $D_2$ is supplied to the first inputs 52a, 54a of both the first and second look-up tables 52, 54. A second select signal $S_1$ is supplied to the third inputs 52c, 54c of both the first and second look-up tables 52, 54. A third select signal $S_2$ is supplied to the fourth input 54d of the second look-up table 54. A carry input $C_{in}$ is supplied on a carry input line 62.

As discussed above, with reference to FIG. 2, the one-bit addition element 64 therefore acts as a multiplexer, with the value of the first select signal $S_0$ determining whether the value on its carry output 68 is the first data input $D_0$ or the value on its carry input line 66. Further, the one-bit addition element 60 also acts as a multiplexer, with the values of the second and third select signals $S_1$, $S_2$ determining whether the value $C_{66}$ on its carry output 66 should be the carry input $C_{in}$, the second data input $D_1$, or the third data input $D_2$.

More specifically, the following table, Table 2, shows the results of the logic, illustrated schematically in the first and second look-up tables 52, 54 of FIG. 4(a), and the effect of the one-bit addition element 60:

TABLE 2

| $D_1$ | $D_2$ | $S_1$ | $S_2$ | $D_1$ multiplexed with $D_2 = R_1$ | $S_1$ OR $S_2 = R_2$ | $R_1$ XOR (not $R_2$) | $C_{66}$ |
|---|---|---|---|---|---|---|---|
| 0 | 0 | 0 | 0 | $D_2 = 0$ | 0 | 1 | $C_{in}$ |
| 0 | 0 | 0 | 1 | $D_2 = 0$ | 1 | 0 | $R_1 = D_2 = 0$ |
| 0 | 0 | 1 | 0 | $D_1 = 0$ | 1 | 0 | $R_1 = D_1 = 0$ |
| 0 | 0 | 1 | 1 | $D_1 = 0$ | 1 | 0 | $R_1 = D_1 = 0$ |
| 0 | 1 | 0 | 0 | $D_2 = 1$ | 0 | 1 | $C_{in}$ |
| 0 | 1 | 0 | 1 | $D_2 = 1$ | 1 | 0 | $R_1 = D_2 = 1$ |
| 0 | 1 | 1 | 0 | $D_1 = 0$ | 1 | 0 | $R_1 = D_1 = 0$ |
| 0 | 1 | 1 | 1 | $D_1 = 0$ | 1 | 0 | $R_1 = D_1 = 0$ |
| 1 | 0 | 0 | 0 | $D_2 = 0$ | 0 | 1 | $C_{in}$ |
| 1 | 0 | 0 | 1 | $D_2 = 0$ | 1 | 0 | $R_1 = D_2 = 0$ |
| 1 | 0 | 1 | 0 | $D_1 = 1$ | 1 | 0 | $R_1 = D_1 = 1$ |
| 1 | 0 | 1 | 1 | $D_1 = 1$ | 1 | 0 | $R_1 = D_1 = 1$ |
| 1 | 1 | 0 | 0 | $D_2 = 1$ | 0 | 1 | $C_{in}$ |
| 1 | 1 | 0 | 1 | $D_2 = 1$ | 1 | 0 | $R_1 = D_2 = 1$ |
| 1 | 1 | 1 | 0 | $D_1 = 1$ | 1 | 0 | $R_1 = D_1 = 1$ |
| 1 | 1 | 1 | 1 | $D_1 = 1$ | 1 | 0 | $R_1 = D_1 = 1$ |

The value $C_{66}$ on the carry output of the one-bit addition element 60 is the value on the carry input line of the one-bit addition element 64.

Figure 4B:
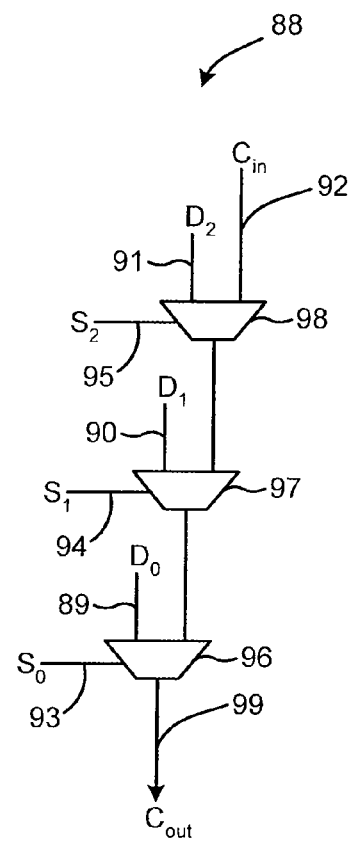

FIG. 4(b) shows a multiplexer 88, which is the logical equivalent of the multiplexer described above, implemented using the adaptive logic module 50. Thus, four input signals $D_0$, $D_1$, $D_2$ and $C_{in}$ are received on input lines 89, 90, 91, 92 respectively, and first, second and third Select signals $S_0$, $S_1$, $S_2$ are supplied on lines 93, 94, 95 respectively. The multiplexer 96 represents the one-bit addition element 64, plus the logic required to form the exclusive OR of $D_0$ and the inverse of $S_0$, while the multiplexers 97, 98 represent the one-bit addition element 60, plus the associated logic. The output $C_{out}$ is provided on line 99.

It can therefore be seen that the multiplexer 88 acts as a priority multiplexer, since the select input signals have a priority ordering. Specifically, the first Select signal $S_0$ has a higher priority than the second Select signal $S_1$, which in turn has a higher priority than the third Select signal $S_2$. If the highest priority Select signal $S_0$ has the value "1", then the first data signal $D_0$ is supplied to the output 99, irrespective of the value of the lower priority select input signal $S_1$. However, if the highest priority Select signal $S_0$ has the value "0", then the value supplied to the output 99 is the value $C_{66}$ on the carry output of the one-bit addition element

60. More specifically, if the second highest priority Select signal $S_1$ has the value "1", then the second data signal $D_1$ is supplied as the value $C_{66}$, irrespective of the value of the lowest priority select input signal $S_2$. However, if the second highest priority Select signal $S_1$ has the value "0", then the value supplied as the value $C_{66}$ is either the third data signal $D_2$ or the carry input $C_{in}$, depending on the value of the lowest priority select input signal $S_2$.

It will also be apparent that, alternatively, the logic could equally well operate such that a value "0" for a Select signal causes the corresponding data signal to be selected. That is, if the highest priority Select signal $S_0$ has the value "0", then the first data signal $D_0$ could be supplied to the output 99, irrespective of the value of the lower priority select input signal $S_1$, but if the highest priority Select signal $S_0$ has the value "1", then the value supplied to the output 99 could be the value $C_{66}$ on the carry output of the one-bit addition element 60, and so on.

Similarly, the data signals $D_0$, $D_1$ and $D_2$ could if required be supplied inverted, with the look-up tables operating to provide the required outputs.

Figure 5:
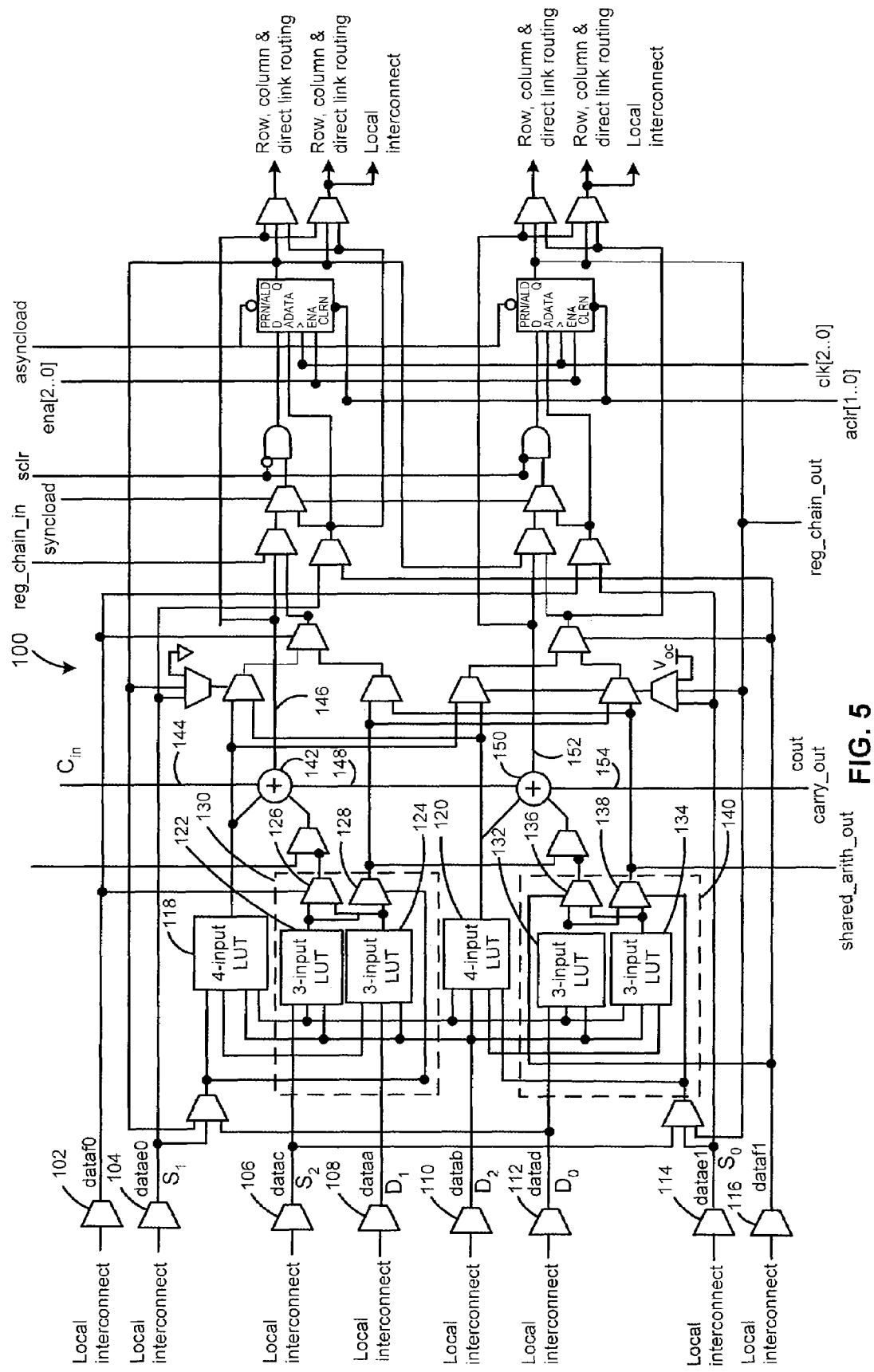
FIG. 5 is a more detailed block schematic diagram of an arithmetic logic module, with inputs causing it to act as a multiplexer in accordance with a further embodiment of the present invention.

FIG. 5 is a further block schematic diagram, showing in more detail one way in which the circuit of FIG. 4(*a*) could be implemented in an adaptive logic module 100 of a Stratix® II FPGA, available from Altera Corporation. The circuit is disclosed in the document Stratix® II Device Handbook, Volume 1, Ver. 1.1, published July 2004 by Altera Corporation, the entire contents of which are hereby incorporated by reference. The circuit of FIG. 4(*a*) could be implemented in the adaptive logic module 100 in other ways, all of which fall within the scope of the present invention.

The adaptive logic module 100 will not be described in further detail, except to note that it includes eight data inputs 102, 104, 106, 108, 110, 112, 114 and 116, which are shared between the combinational logic of the module. The combinational logic includes first and second 4-input look-up tables (LUTs) 118, 120. In addition, the combinational logic includes two 3-input LUTs 122, 124 and associated multiplexers 126, 128, which together form a third 4-input LUT 130, plus two 3-input LUTs 132, 134 and associated multiplexers 136, 138, which together form a fourth 4-input LUT 140.

The outputs of the first 4-input LUT 118 and the third 4-input LUT 130 are combined in a first one-bit adder 142, together with a carry input on line 144, to form a sum on line 146 and a carry output on line 146. The outputs of the second 4-input LUT 120 and the fourth 4-input LUT 140 are combined in a second one-bit adder 142, together with the carry output from the first one-bit adder 142 on line 146, to form a sum on line 152 and a carry output on line 154.

In order to implement the multiplexer as shown in FIG. 4(*a*), a first data input $D_0$ is supplied on the data input 112; a second data input $D_1$ is supplied on the data input 108; a third data input $D_2$ is supplied on the data input 110; a first select signal $S_0$ is supplied on the data input 114; a second select signal $S_1$ is supplied on the data input 104; a third select signal $S_2$ is supplied on the data input 106. A carry input $C_{in}$ is supplied on the carry input line 144.

Further, the first 4-input LUT 118 is programmed to perform the logic function illustrated schematically in block 54 of FIG. 4(*a*). That is, the first 4-input LUT 118 is programmed to provide as an output the value of [$R_1$ XOR (not $R_2$)] from its inputs, as shown in Table 3:

TABLE 3

| $D_1$ | $D_2$ | $S_1$ | $S_2$ | $R_1$ XOR (not $R_2$) |
|---|---|---|---|---|
| 0 | 0 | 0 | 0 | 1 |
| 0 | 0 | 0 | 1 | 0 |
| 0 | 0 | 1 | 0 | 0 |
| 0 | 0 | 1 | 1 | 0 |
| 0 | 1 | 0 | 0 | 1 |
| 0 | 1 | 0 | 1 | 0 |
| 0 | 1 | 1 | 0 | 0 |
| 0 | 1 | 1 | 1 | 0 |
| 1 | 0 | 0 | 0 | 1 |
| 1 | 0 | 0 | 1 | 0 |
| 1 | 0 | 1 | 0 | 0 |
| 1 | 0 | 1 | 1 | 0 |
| 1 | 1 | 0 | 0 | 1 |
| 1 | 1 | 0 | 1 | 0 |
| 1 | 1 | 1 | 0 | 0 |
| 1 | 1 | 1 | 1 | 0 |

Thus, for the supplied values of $D_1$, $D_2$, $S_1$, and $S_2$, the first 4-input LUT 118 supplies as an output to the first adder 142 the value shown in the column headed $R_1$ XOR (not $R_2$).

The third LUT 130 is used to multiplex together $D_1$ and $D_2$, under the control of the value of $S_1$, and to route the result as the second input to the first adder 142. That is, the third LUT 130 is programmed to provide as an output the value of $R_1$ from its inputs, as shown in Table 4:

TABLE 4

| $D_1$ | $D_2$ | $S_1$ | $D_1$ multiplexed with $D_2 = R_1$ |
|---|---|---|---|
| 0 | 0 | 0 | $D_2 = 0$ |
| 0 | 0 | 0 | $D_2 = 0$ |
| 0 | 0 | 1 | $D_1 = 0$ |
| 0 | 0 | 1 | $D_1 = 0$ |
| 0 | 1 | 0 | $D_2 = 1$ |
| 0 | 1 | 0 | $D_2 = 1$ |
| 0 | 1 | 1 | $D_1 = 0$ |
| 0 | 1 | 1 | $D_1 = 0$ |
| 1 | 0 | 0 | $D_2 = 0$ |
| 1 | 0 | 0 | $D_2 = 0$ |
| 1 | 0 | 1 | $D_1 = 1$ |
| 1 | 0 | 1 | $D_1 = 1$ |
| 1 | 1 | 0 | $D_2 = 1$ |
| 1 | 1 | 0 | $D_2 = 1$ |
| 1 | 1 | 1 | $D_1 = 1$ |
| 1 | 1 | 1 | $D_1 = 1$ |

The second LUT 120 is used to form the exclusive OR of $D_0$ and $S_0$, and to route the result to the second adder 150.

The fourth LUT 140 is simply used to route $D_0$ as the second input to the second adder 150.

Thus, the adaptive logic module 100 can be used to form a multiplexer as shown in FIG. 4(*a*). Moreover, it will be apparent that multiple adaptive logic modules can be connected together to form a chain, acting as a multiplexer with any desired number of data inputs. Since each of the adaptive logic modules receives three new data inputs, and each adaptive logic module after the first also receives the carry input from the preceding module, a chain of n modules can multiplex (3n+1) data inputs.

As mentioned above, a circuit which operates in essentially the same way as the circuit of FIG. 4(*a*) could be implemented in the adaptive logic module 100 in other ways. For example, whereas, in FIG. 5, the first and third 4-input LUTs 118, 130 operate on two new data inputs while the second and fourth LUTs 120, 140 operate on just one new data input, the circuit could be rearranged such that the first and third 4-input LUTs 118, 130 operate on just one new data input while the second and fourth LUTs 120, 140 operate on two new data inputs.

Similarly, whereas, in FIG. 5, it is the first and second 4-input LUTs 118, 120 which output the result of the XOR function, the circuit could be rearranged such that the third and fourth 4-input LUTs 130, 140 output the result of the XOR function.

It will also be apparent that, in the case of a different adaptive logic module, the multiplexer can be implemented in a different way, while still retaining the essential features of the present invention. For example, in the case of an adaptive logic module with larger look-up tables, or with fewer constraints on the way in which the inputs are shared amongst the look-up tables, it may be possible to implement a multiplexer which is able to receive an increased number of new data inputs.

There is therefore disclosed a multiplexer, which can advantageously be formed from one-bit addition elements, for example as provided in an FPGA.

The invention claimed is:

1. A multiplexer, comprising:
an addition element, adapted to receive first and second one-bit values and a carry input value, and to supply a carry output value, the carry output value being high every time two or more of the first and second one-bit values and the carry input value are high; and
a logic device, for receiving a first data input value and a first select input,
wherein the logic device is adapted to route the first data input to the addition element as the first one-bit value; and
wherein the logic device is adapted to route the first data input to the addition element as the second one-bit value when the first select input takes a first value, and is adapted to route an inverse of the first data input to the addition element as the second one-bit value when the first select input takes a second value.

2. A multiplexer as claimed in claim 1, wherein the addition element comprises a one-bit addition element.

3. A multiplexer as claimed in claim 1, wherein the logic device is adapted to perform a logical XOR function on the first data input and the first select input, and to route a result thereof to the addition element as the second one-bit value.

4. A multiplexer as claimed in claim 1, wherein the logic device comprises a look-up table.

5. A multiplexer as claimed in claim 4 wherein the look-up table is formed on a field programmable gate array.

6. A multiplexer as claimed in claim 1, wherein the addition element further provides a sum, wherein the sum is high whenever one or all of the first and second one-bit values and the carry input value are high.

7. A multi-input multiplexer, comprising:
a first addition element, adapted to receive first and second one-bit values and a first carry input value, and to supply a first carry output value, the first carry output value being high when two or more of the first and second one-bit values and the first carry input value are high;
a first logic device, for receiving a first data input value and a first select input;
a second addition element, adapted to receive third and fourth one-bit values and a second carry input value, and to supply a second carry output value, the second carry output value being high when two or more of the third and fourth one-bit values and the second carry input value are high; and a second logic device, for receiving a second data input value and a second select input,
wherein the first logic device is adapted to always route the first data input to the first addition element as the first one-bit value;
wherein the first logic device is adapted to route the first data input to the first addition element as the second one-bit value when the first select input takes a first value, and is adapted to route an inverse of the first data input to the first addition element as the second one-bit value when the first select input takes a second value;
wherein the second logic device is adapted to always route the second data input to the second addition element as the third one-bit value;
wherein the second logic device is adapted to route the second data input to the second addition element as the fourth one-bit value when the second select input takes a first value, and is adapted to route an inverse of the second data input to the second addition element as the fourth one-bit value when the second select input takes a second value; and
wherein the second carry output value of the second addition element is supplied to the first addition element as the first-carry input value.

8. A multi-input multiplexer as claimed in claim 7, wherein the first logic device comprises a first pair of look-up tables.

9. A multi-input multiplexer as claimed in claim 8 wherein the first pair of look-up tables are formed on a field programmable gate array.

10. A multi-input multiplexer as claimed in claim 7, wherein the second logic device comprises a second pair of look-up tables.

11. A multi-input multiplexer as claimed in claim 7, wherein the first logic device is adapted to perform a logical XOR function on the first data input and the first select input, and to route a result thereof to the addition element as the second one-bit value.

12. A multi-input multiplexer as claimed in claim 7, wherein the first addition element further provides a sum, wherein the sum is high whenever one or all of the first and second one-bit values and the first carry input value are high.

13. A multi-input multiplexer, comprising:
a first addition element, adapted to receive first and second one-bit values and a first carry input value, and to supply a first carry output value, the first carry output value being high every time two or more of the first and second one-bit values and the first carry input value are high;
a first logic device, for receiving a first data input value and a first select input;
a second addition element, adapted to receive third and fourth one-bit values and a second carry input value, and to supply a second carry output value, the second carry output value being high when two or more of the third and fourth one-bit values and the second carry input value are high; and
a second logic device, for receiving second and third data input values and second and third select inputs,
wherein the first logic device is adapted to route the first data input to the first addition element as the first one-bit value;
wherein the first logic device is adapted to route the first data input to the first addition element as the second one-bit value when the first select input takes a first value, and is adapted to route an inverse of the first data input to the first addition element as the second one-bit value when the first select input takes a second value;

wherein the second logic device is adapted to select between the second and third data input values based on the third select input, and to form an intermediate value as the result of the selection;

wherein the second logic device is adapted to route the intermediate value to the second addition element as the third one-bit value;

wherein the second logic device is adapted to route the intermediate value to the second addition element as the fourth one-bit value when the second select input takes a first value, and is adapted to route an inverse of the intermediate value to the second addition element as the fourth one-bit value when the second select input takes a second value; and wherein the second carry output value of the second addition element is supplied to the first addition element as the first carry input value.

14. A multi-input multiplexer as claimed in claim 13, wherein the first logic device comprises a first pair of look-up tables.

15. A multi-input multiplexer as claimed in claim 14 wherein the first pair of look-up tables are formed on a field programmable gate array.

16. A multi-input multiplexer as claimed in claim 13, wherein the second logic device comprises a second pair of look-up tables.

17. A multi-input multiplexer as claimed in claim 16, wherein:

a first look-up table of said second pair of look-up tables is adapted to receive said second and third data input values and said third select input, and to output said intermediate value as the third one-bit value; and a second look-up table of said second pair of look-up tables is adapted to receive said second and third data input values and said second and third select inputs, and to output a result of a logical XOR function on said intermediate value and said second select input as the fourth one-bit value.

18. A multi-input multiplexer as claimed in claim 13, wherein the first logic device is adapted to perform a logical XOR function on the first data input and the first select input, and to route a result thereof to the addition element as the second one-bit value.

19. A multi-input multiplexer as claimed in claim 13, wherein the first addition element further provides a sum, wherein the sum is high whenever one or all of the first and second one-bit values and the first carry input value are high.

20. A field programmable gate array, comprising:

a plurality of one-bit addition elements, comprising respective carry inputs and carry outputs, with the carry outputs of the one-bit addition elements being connected to the carry inputs of respective succeeding one-bit addition elements in a chain; and a plurality of logic resources, connected to receive input signals and to supply output signals to respective one-bit addition elements of said chain, wherein each of said logic resources is adapted to:

receive a respective data input and select input;

always supply the respective data input as a first input to the respective one-bit addition element; and supply a logical XOR of the respective data input and the inverse of the select input as a second input to the respective one-bit addition element.

* * * * *

UNITED STATES PATENT AND TRADEMARK OFFICE
CERTIFICATE OF CORRECTION

| | |
|---|---|
| PATENT NO. | : 7,336,099 B1 |
| APPLICATION NO. | : 11/021685 |
| DATED | : February 26, 2008 |
| INVENTOR(S) | : Dominic Nancekievill |

Page 1 of 1

It is certified that error appears in the above-identified patent and that said Letters Patent is hereby corrected as shown below:

On the title page, Item "[75] Inventor", change "Donimic" to --Dominic--

Signed and Sealed this

Twenty-second Day of July, 2008

JON W. DUDAS
*Director of the United States Patent and Trademark Office*